(12) United States Patent
Kitazawa et al.

(10) Patent No.: US 7,852,128 B2
(45) Date of Patent: Dec. 14, 2010

(54) DRIVING CIRCUIT FOR CAPACITIVE LOAD AND LIQUID INJECTING APPARATUS

(75) Inventors: Koji Kitazawa, Shiojiri (JP); Noboru Tamura, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 23 days.

(21) Appl. No.: 12/370,809

(22) Filed: Feb. 13, 2009

(65) Prior Publication Data
US 2009/0206888 A1 Aug. 20, 2009

(30) Foreign Application Priority Data
Feb. 14, 2008 (JP) ............................. 2008-033828

(51) Int. Cl.
*H03B 1/00* (2006.01)
(52) U.S. Cl. ...................... 327/112; 327/111
(58) Field of Classification Search .............. 327/111, 327/112
See application file for complete search history.

(56) References Cited

U.S. PATENT DOCUMENTS

| | | | | |
|---|---|---|---|---|
| 4,423,341 A | * | 12/1983 | Shelly | 327/112 |
| 5,121,011 A | * | 6/1992 | Ohya et al. | 327/432 |
| 5,933,034 A | * | 8/1999 | Hastings et al. | 327/108 |
| 5,963,066 A | * | 10/1999 | Fukunaga | 327/112 |
| 6,018,257 A | * | 1/2000 | Hung et al. | 327/112 |
| 7,276,958 B2 | * | 10/2007 | Miyamitsu et al. | 327/536 |

FOREIGN PATENT DOCUMENTS

JP 2006-272907 10/2006

* cited by examiner

*Primary Examiner*—Hai L Nguyen
(74) *Attorney, Agent, or Firm*—Workman Nydegger

(57) ABSTRACT

A driving circuit for a capacitive load includes a driving signal generating unit that generates a driving signal for driving the capacitive load by using a pair of driving transistors. A power source voltage generating unit generates high-voltage and low-voltage power source voltages that are higher and lower, respectively, than the voltage of the driving signal and applies the voltages to collectors of the driving transistors. The power source voltage generating unit includes a pair of power source transistors and a capacitor. The low-voltage power source voltage is generated in an output side of the power-source transistor pair as a voltage that is in a voltage region lower than that of the driving signal and follows the driving signal. The high-voltage power source voltage is output from a high-voltage terminal of the capacitor, is in a voltage region higher than that of the driving signal, and follows the driving signal.

5 Claims, 5 Drawing Sheets

DRIVING CIRCUIT FOR CAPACITIVE LOAD AND LIQUID INJECTING APPARATUS

BACKGROUND

1. Technical Field

The present invention relates to a driving circuit for a capacitive load and a liquid injecting apparatus, and more particularly, to an ink jet record head that drives a piezoelectric element by using a driving signal having a trapezoidal shape and an ink jet recording apparatus having the ink jet record head.

2. Related Art

As liquid injecting apparatuses that perform a printing process or the like by injecting a liquid in accordance with supply of a driving signal and landing the liquid in a target, for example, ink jet recording apparatuses including an ink jet record head that injects ink droplets from a nozzle opening by using pressure that is generated by displacement of a piezoelectric element have been known. In the liquid injecting apparatus of this type, supply of a sufficient current is needed so as to operate a plurality of the piezoelectric elements without any problem. Accordingly, a driving signal of which current is amplified by a current amplifying unit is used.

When the current of the driving signal is amplified by the current amplifying unit, the power consumption of a charging transistor is an amount acquired from multiplying the current by a difference between the electric potentials of the power source and the driving signal. On the other hand, the power consumption of a discharging transistor is an amount acquired from multiplying a current by a difference between the electric potential of the driving signal and the ground electric potential. Accordingly, the power consumption of each transistor is increased, and thus, technology for decreasing the power consumption as possibly as can be has been requested. As general technology for decreasing the power consumption due to the driving current in response to the request, technology has been disclosed in JP-A-2006-272907.

In the driving circuit disclosed in JP-A-2006-272907, for a main driving signal having a trapezoidal shape that is used for driving a piezoelectric element, an auxiliary driving signal that is offset by a predetermined amount so as to follow the shape of the main driving signal is generated, and the auxiliary driving signal is used as the power-source voltage. Accordingly, the difference between the main driving signal and the power-source voltage is decreased, and whereby the power consumption is reduced.

Thus, the driving circuit includes a main driving signal generating unit that generates a main driving signal through the transistor pair based on an analog signal and an auxiliary driving signal generating unit that generates an auxiliary driving signal through other transistors and a smoothing circuit based on a pulse signal. The pulse signal is acquired from comparing a signal representing the main driving signal generated by using a PWM circuit and a chopping wave by using a comparator.

However, in the PWM circuit of the driving circuit disclosed in JP-A-2006-272907, for the signal representing the main driving signal to be compared with the chopping wave, a process for adding a specific value to the main driving signal so as to add an offset to the main driving signal or the like is performed. Accordingly, the adjustment operation for adding a predetermined offset is troublesome. In addition, a difference between the main driving signal and the auxiliary driving signal may decrease due to delay of the smoothing circuit or the like, and in such a case, the operation is unstable. Recently, the frequency of the main driving signal has been increased prominently, and thus, the influence of the delay cannot be ignored as that much. On the other hand, when the offset value between the main driving signal and the auxiliary driving signal is set to be large from the start, there is a problem that it is difficult to decrease the power consumption by reducing the heat loss of the transistor pair.

SUMMARY

An advantage of some aspects of the invention is that it provides a driving circuit for a capacitive load and a liquid injecting apparatus that are capable of appropriately reducing the power consumption, compared to a case where general technology is used, and assuring a stable operation even in a high frequency band.

According to a first aspect of the invention, there is provided a driving circuit for a capacitive load. The driving circuit includes: a driving signal generating unit that generates a driving signal for driving the capacitive load by using a driving transistor pair including two transistors connected complementarily; and a power source voltage generating unit that generates a high-voltage power source voltage that is higher than the voltage of the driving signal and a low-voltage power source voltage that is lower than the voltage of the driving signal and applies the high-voltage power source voltage and the low-voltage power source voltage to the collectors of the driving transistors. The power source voltage generating unit is configured by a power source transistor pair including two transistors connected complementarily and a capacitor of which low-voltage terminal is connected to an output side of the power source transistor pair. In addition, the low-voltage power source voltage is generated in an output side of the power-source transistor pair as a voltage that is in a voltage region lower than that of the driving signal and follows the driving signal and is output from a low-voltage terminal of the capacitor by supplying a control signal having a waveform following the driving signal to an input side of the power source transistor pair, and the high-voltage power source voltage is output from a high-voltage terminal of the capacitor as a voltage that is acquired from adding a charged voltage of the capacitor to the low-voltage power source voltage, is in a voltage region higher than that of the driving signal, and follows the driving signal.

According to the above-described driving circuit, the control process is performed for the power source transistor pair by using a control signal configured to follow the driving signal in a voltage region lower than that of the driving signal. Accordingly, the low-voltage power source voltage following the driving signal in the voltage region lower than that of the driving signal can be generated in the low-voltage output terminal of the capacitor in an easy manner. In addition, the high-voltage power source voltage that is higher than the low-voltage power source voltage by a predetermined value can be generated in the voltage region higher than that of the driving signal based on the low-voltage power source voltage in the high-voltage output terminal of the capacitor in an easy manner.

As a result, the voltage differences between the high-voltage power source voltage and the lower-voltage power source voltage and the driving signal can be decreased. Accordingly, the power consumption of the driving transistor pair due to the voltage differences can be decreased as that much. In such a case, a decrease in the power consumption can be easily responded by increasing the number of stages of the power source.

In addition, adjustment of the amount of an offset in which a delay factor of the smoothing circuit and the like are considered is not needed, and the low-voltage power source voltage and the high-voltage power source voltage can be configured to follow the driving signal sufficiently by only having the waveform of the control signal for controlling the operation of the power source transistor pair to follow that of the driving signal. As a result, an increase in the frequency of the driving signal can be responded well without considering an unstable factor such as delay.

In the above-described driving circuit for the capacitive load, the power-source transistor pair may be configured appropriately by a source follower of an N-channel FET and a P-channel FET. In addition, in the above-described driving circuit for the capacitive load, it is preferable that the charge pumps are configured to have multiple stages by tandem-connecting a plurality of units of the charge pumps. In such a case, the low-voltage power source voltage and the high-voltage power source voltage can be configured to follow the waveform of the driving signal more appropriately, and accordingly, a decrease in the power consumption can be achieved more effectively by that much.

In addition, in the above-described driving circuit for the capacitive load, it is preferable that the capacitive load is a piezoelectric element of a liquid injecting head that injects liquid droplets through a nozzle opening by being displaced in accordance with application of a voltage. Generally, the piezoelectric element of the liquid injecting head uses a driving signal that combines waveforms having a trapezoidal shape. In such a case, the high-voltage power source voltage and the low-voltage power source voltage can be formed so as to follow the shape of the driving signal with a predetermined amount of the offset acquired, in an easy manner.

According to a second aspect of the invention, there is provided a liquid injecting apparatus including the above-described driving circuit for the capacitive load. This aspect can contribute to a decrease in the power consumption of the liquid injecting apparatus.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
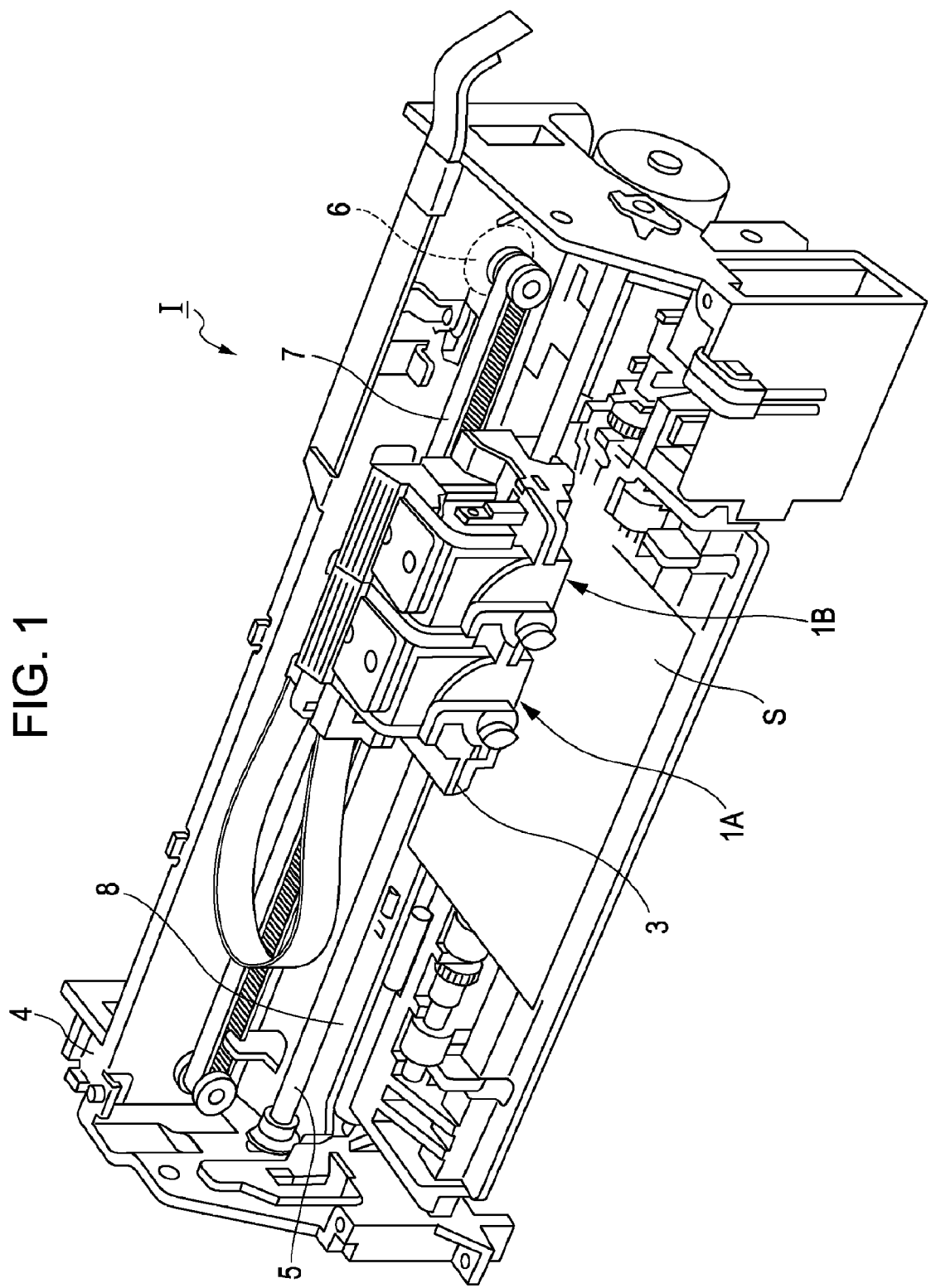
FIG. 1 is a schematic perspective view showing the configuration of a liquid injecting apparatus according to an embodiment of the invention.

FIG. 1 is a schematic diagram showing an example of an ink jet recording apparatus. As shown in FIG. 1, record head units 1A and 1B are installed to the ink jet recording apparatus I as a liquid injecting apparatus. In other words, the record head units 1A and 1B are mounted to a carriage 3 of the ink jet recording apparatus I. In addition, the carriage 3 is installed to a carriage shaft 5, which is installed to a main body 4 of the ink jet recording apparatus I, to be movable in the direction of the shaft. These record head units 1A and 1B, for example, discharge a black ink composition and a color ink composition.

By transferring the driving force of a driving motor 6 to the carriage 3 through a plurality of gears not shown in the figure and a timing belt 7, the carriage 3 to which the record head units 1A and 1B are mounted is moved along the carriage shaft 5. In addition, a platen 8 is installed to the main body 4 along the carriage shaft 5, and a recording sheet S that is a recording medium such as a paper sheet fed by a paper feed roller not shown in FIG. 1 or the like can be wound around the platen 8 to be transported.

Figure 2:
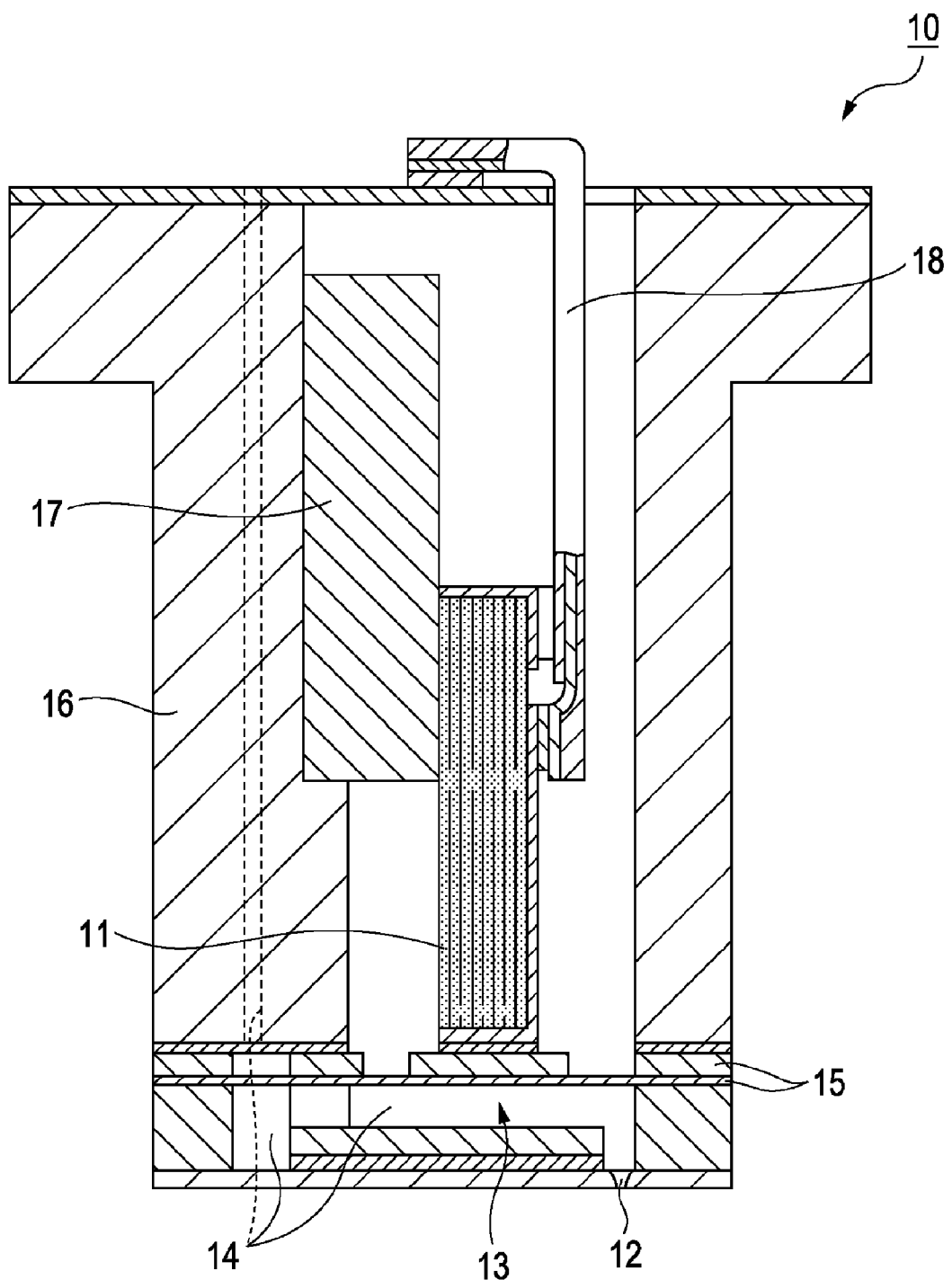
FIG. 2 is a schematic cross-section view showing the configuration of a liquid injecting head according to an embodiment of the invention.

FIG. 2 is a schematic cross-section view showing an example of the ink-jet record head 10 that is installed into the record head units 1A and 1B shown in FIG. 1. As shown in the figure, the ink-jet record head 10 includes a pressure generating chamber 13 that is communicated with a nozzle opening 12 for injecting ink, a flow path 14 that allows the pressure generating chamber 13 and an ink cartridge not shown in the figure to be communicated with each other, a diaphragm 15 that is disposed to face the pressure generating chamber 13, and a piezoelectric element 11 that generates a pressure change in the pressure generating chamber 13 through the diaphragm 15. The piezoelectric element 11 is fixed to a case 16 through a fixing plate 17. Near a base end part of the piezoelectric element 11, a wiring 18 that supplies a signal for driving each piezoelectric element 11, that is, a driving signal is disposed on a face opposite to the fixing plate 17. This wiring 18 is connected to a head control unit (not shown). In such an ink-jet record head 10, a driving signal S2 is transmitted from the head control unit 30 to the ink-jet record head 10 through the wiring 18, and accordingly, the driving signal S2 is applied to the piezoelectric element 11. The piezoelectric element 11 is expanded and contracted by repeatedly being charged and discharged in accordance with the driving signal S2, and thereby the diaphragm 15 is deformed so as to change the volume of the pressure generating chamber 13. Then, ink droplets are discharged from a predetermined nozzle opening 12 in accordance with the change in the volume of the pressure generating chamber 13.

Figure 3:
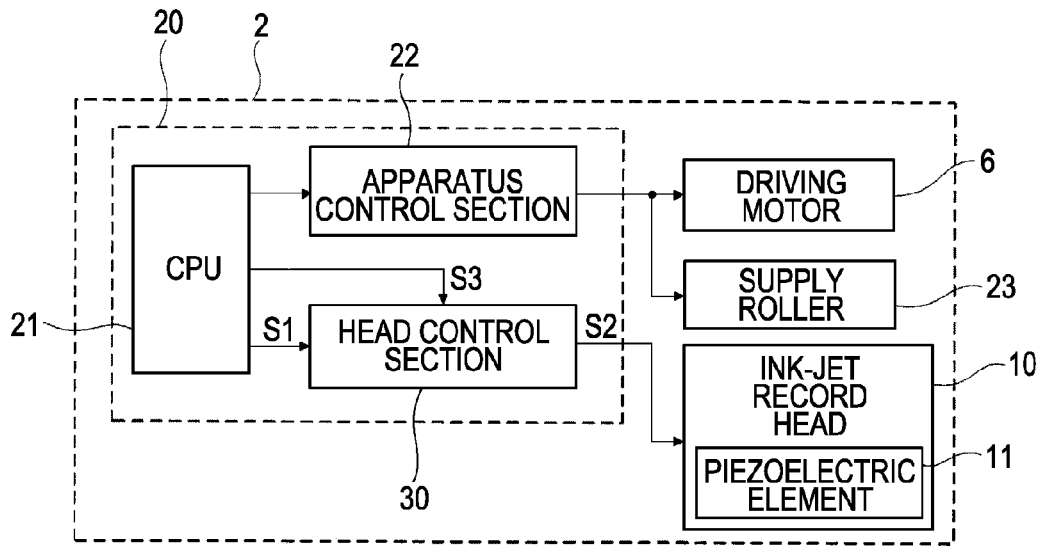
FIG. 3 is a block diagram showing the configuration of a control system of a liquid injecting apparatus according to an embodiment of the invention.

FIG. 3 is a block diagram showing a control system of the ink jet recording apparatus I. As shown in the figure, a control unit 20 that performs control of the ink jet recording apparatus I is provided in the ink jet recording apparatus I. The control unit 20 includes a CPU 21, an apparatus control section 22, a head control section 30 that is a driving circuit for the piezoelectric element 11 as a capacitive load.

Described in more details, when a signal indicative of movement of the carriage 3 (see FIG. 1) is input to the apparatus control section 22 from the CPU 21, the apparatus control section 22 drives a driving motor 6 so as to move the carriage 3 along the carriage shaft 5. In addition, a signal indicative of transport of a recording sheet S (see FIG. 1) is input to the apparatus control section 22 from the CPU 21, so that the apparatus control section 22 drives the paper feed roller 23 so as to transport the recording sheet S.

In addition, an analog signal S1 for generating a head driving signal S2 and a control signal S3 for controlling (to be described later in detail) the operation of the head control section 30 are input to the head control section 30 from the CPU 21. As a result, the head control section 30 selectively applies the driving signal S2 to the piezoelectric elements 11 of the ink-jet record head 10 so as to discharge ink. Here, a driver IC of the ink-jet record head 10 not shown in the figure is supplied with a head control signal from the CPU 21 for selectively driving the piezoelectric elements 11.

Figure 4:
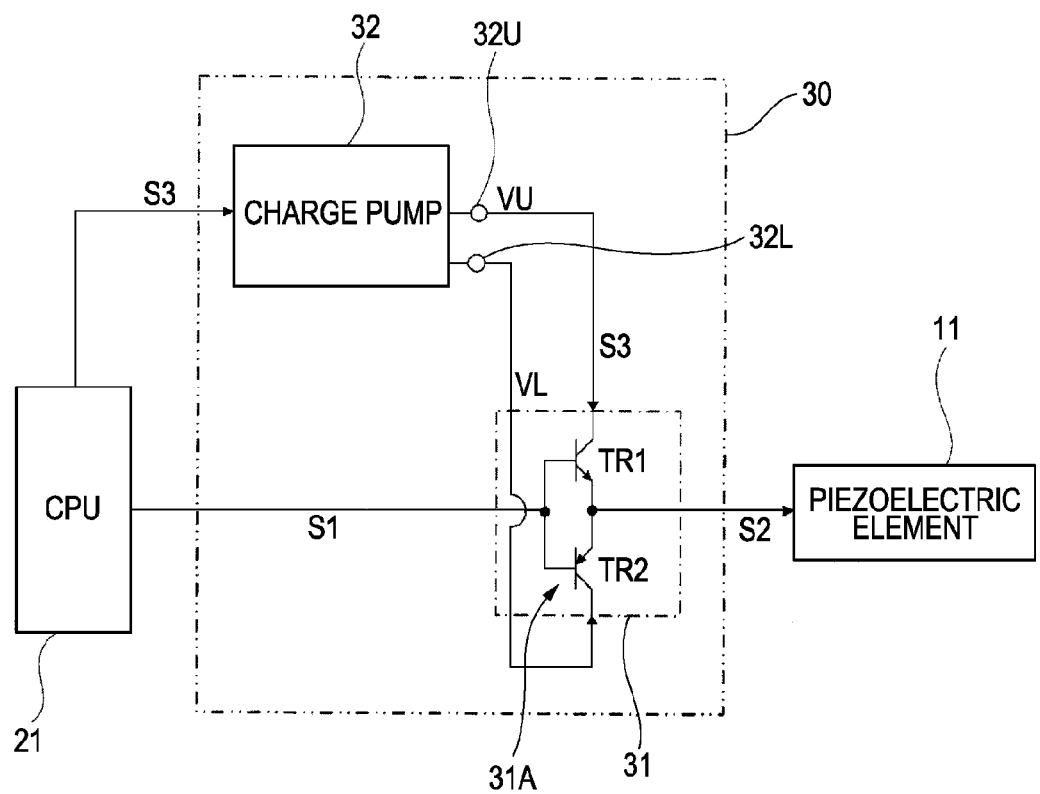
FIG. 4 is a block diagram showing the configuration of a head control section according to an embodiment of the invention.

FIG. 4 is a detailed block diagram of the head control section 30 that controls the ink-jet record head 10 as described above. As shown in the figure, the head control section 30 includes a driving transistor pair 31A that is a driving signal generating part 31 according to this embodiment for generating the head driving signal S2 (see FIG. 3) and a charge pump 32 that is a power source voltage generating part for generating a high voltage power source voltage VU and a low voltage power source voltage VL.

Here, the driving transistor pair 31A generates the driving signal S2 based on the analog signal S1 that is supplied to the bases of an NPN transistor TR1 and a PNP transistor TR2 that constitute the driving transistor pair 31A. The analog signal S1 is acquired from performing a D/A conversion process for digital data of the driving signal S2 stored in the CPU 21 inside the CPU 21.

In addition, the charge pump 32, to be described later in detail, is configured to have multiple stages. Thus, by configuring a plurality of types of voltages in accordance with the control signal S3 that is output from the CPU 21, a high-voltage power source voltage VU and a low-voltage power source voltage VL that have shapes following the shape of the driving signal S2 are configured to be applied to the collectors of the transistors TR1 and TR2 through a high-voltage output terminal 32U and a low-voltage output terminal 32L. Here, the low-voltage power source voltage VL has a predetermined low voltage value acquired from subtracting a predetermined voltage value from the driving signal S2. On the other hand, the high-voltage power source voltage VU has a high voltage value acquired from adding a predetermined voltage value to the low-voltage power source voltage VL. In addition, the high-voltage power source voltage VU has voltage value higher than that of the driving signal S2. In other words, the high-voltage power source voltage VU and the low-voltage power source voltage VL are voltages that change in the same pattern as that of the driving signal S2 to be higher and lower than the driving signal S2 with the driving signal S2 interposed therebetween.

In the head control section 30, the analog signal S1 that is generated by the CPU 21 is input to the bases of the transistors TR1 and TR2 of the driving transistor pair 31A. As a result, the driving transistor pair 31A generates the driving signal S2 that supplies a current sufficient for simultaneously operating the multiple piezoelectric elements 11 by amplifying the analog signal S1.

Here, the driving transistor pair 31A is a push-pull amplifier circuit configured by the transistors TR1 and TR2 that are connected complementarily. By using such an amplifier circuit, a high current amplification factor can be acquired. When the configuration is described in detail, the driving transistor pair 31A is constituted by the NPN transistor TR1 and the PNP transistor TR2 of which emitter are connected together. The transistor TR1 operates when the voltage value of the driving signal S2 rises and thus, is a transistor that is used for charging the piezoelectric element 11. To the collector of the transistor TR1, the high-voltage power source voltage VU is applied. On the other hand, the PNP transistor TR2 operates when the voltage value of the driving signal S2 falls and thus, is a transistor that is used for discharging the piezoelectric element 11. To the collector of the transistor TR2, the low-voltage power source voltage VL is applied. In addition, the transistors TR1 and TR2 are connected at the emitters thereof, and the driving signal S2 is output to the piezoelectric element 11 from this connection part.

The operation of the driving transistor pair 31A is controlled based on an analog signal S1 that is input to the bases of the transistors TR1 and TR2. For example, in a case where the electric potential of the analog signal S1 is in the rising state, when the electric potential of the base of the transistor TR1 becomes higher than that of the emitter by a predetermined value or more, the transistor TR1 is turned on. In accordance with the above-described operation, the electric potential of the driving signal S2 also rises. On the other hand, in a case where the electric potential of the analog signal S1 is in the falling state, when the electric potential of the base of the transistor TR2 becomes lower than that of the emitter by a predetermined value or more, the transistor TR2 is turned on. In accordance with the above-described operation, the electric potential of the driving signal S2 also falls. As described above, the waveform of the electric potential of the driving signal S2 is controlled to be a shape similar to that of the voltage of the analog signal S1.

Here, according to this embodiment, by performing a predetermined control process for the charge pump 32, the high-voltage power source voltage VU and the low-voltage power source voltage VL can be generated in the high-voltage output terminal 32U and the low-voltage output terminal 32L such that the waveforms of the high-voltage power source voltage VU and the low-voltage power source voltage VL follow that of the driving signal S2 in the upper and lower sides. Accordingly, the high-voltage power source voltage VU and the low-voltage power source voltage VL are used as the power source voltages of the driving transistor pair 31A.

As a result, differences between the high-voltage power source voltage VU and the low-voltage power source voltage VL and the voltage value of the driving signal S2 can be decreased. Accordingly, the power consumption of the driving transistor pair 31A can be decreased as that much.

Figure 5:
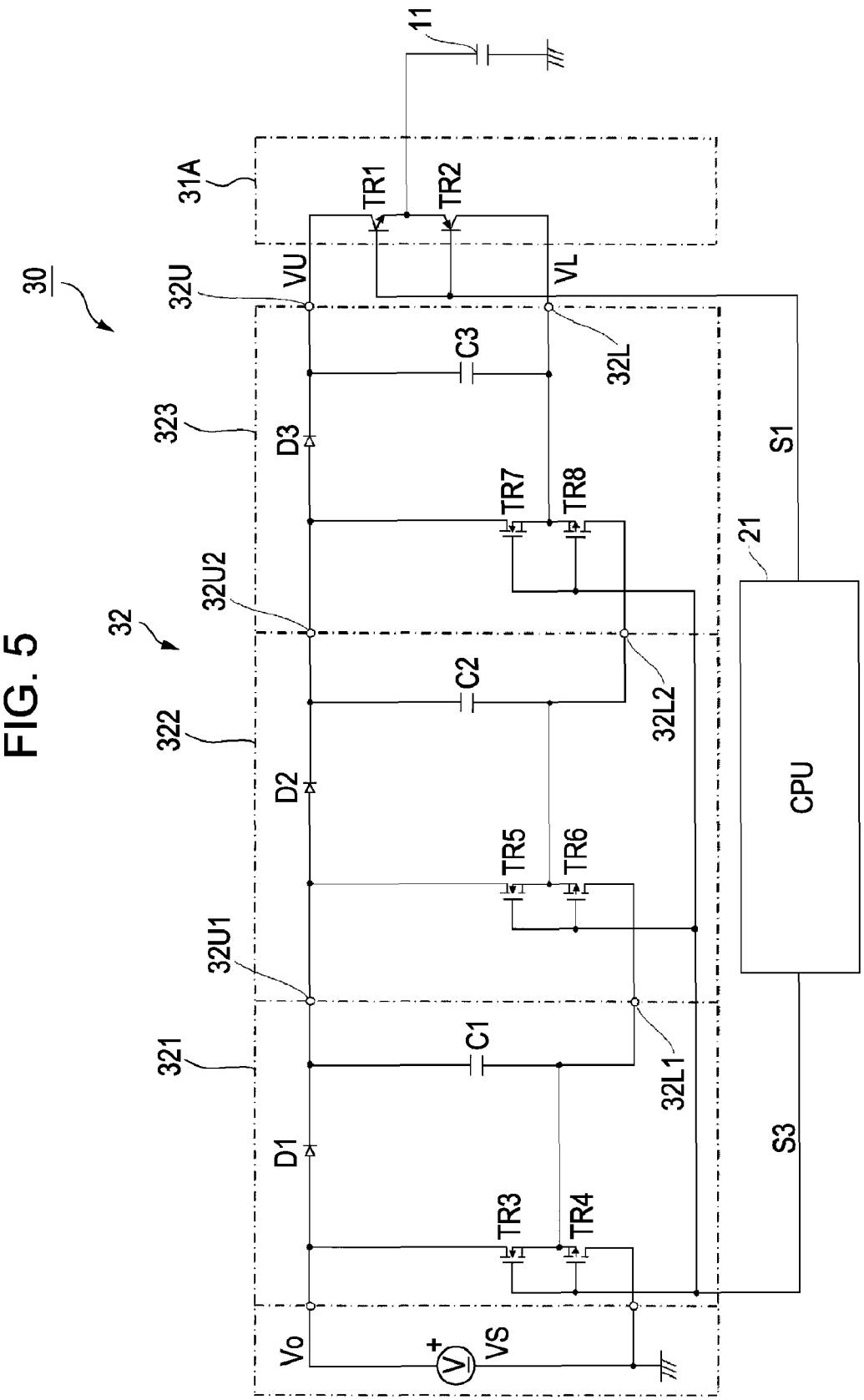
FIG. 5 is a circuit diagram showing a detailed circuit configuration of a head control section according to an embodiment of the invention.

FIG. 5 is a detailed circuit diagram of the head control section 30 according to this embodiment including the charge pump. The detailed configuration of the charge pump 32 will now be described based on the figure. In FIG. 5, to each same part as that of FIG. 4, a same reference sign is assigned, and a duplicate description thereof is omitted here.

As shown in FIG. 5, one capacitor C1, C2, or C3 is disposed in each stage of the charge pump 32, and charge pump units 321, 322, and 323 of three stages in which the charge pumps are connected in parallel with the voltage source VS are tandem-connected. In other words, between adjacent capacitors C1, C2, and C3 having the same capacitance, diodes D1, D2, and D3 as backflow prevention units are connected, and transistors TR3, TR4, TR5, TR6, TR7, and TR8 that form the power source transistor pairs that are N-channel and P-channel FETs used for selectively connecting the adjacent capacitors C1, C2, and C3 in series are disposed. The transistors (TR3 and TR4), (TR5 and TR6), and (TR7 and TR8) are configured as source followers formed by FET pairs of an N-channel FET and a P-channel FET that are connected complementarily in the charge pump units 321 to 323 of the first to third stages. The output of the FET pair of the charge pump unit 321 of the first stage is connected to the drain of the P-channel FET (transistor TR6) of the charge pump unit 322 of the adjacent second stage. In addition, in the same manner, the output of the FET pair of the charge pump unit 322 of the second stage is connected to the drain of the P-channel FET (transistor TR8) of the charge pump unit 323 of the adjacent third stage. In addition, the drain of the P-channel FET (transistor TR4) of the charge pump unit 321 of the first stage has the ground electric potential.

The transistors (TR3 and TR4), (TR5 and TR6), and (TR7 and TR8) that configures the source followers have outputs that are the same as the inputs of the gates. Thus, when the drain voltage of the N-channel FET (transistors TR3, TR5, and TR7) is higher than the gate voltage thereof, the output is the same as the gate input. On the other hand, when the drain voltage of the N-channel FET is lower than the gate voltage, the drain voltage is output directly.

Here, according to this embodiment, the control signal S3 is commonly supplied to the gates of transistors (TR3 and TR4), (TR5 and TR6), and (TR7 and TR8) from the CPU 21. Thus, when the electric potentials of the gates of the transistors TR3, TR5, and TR7 are higher than the GND electric potential, the transistors TR3, TR5, and TR7 serve to discharge the capacitors C1, C2, and C3. On the other hand, when the electric potentials of the gates of the transistors TR4, TR6, and TR8 are lower than the electric potential Vo, the transistors TR3, TR5, and TR7 serve to charge the capacitors C1, C2, and C3. As a result, the electric potentials of the drains of the transistors TR6 and TR8 become the electric potentials of the low-voltage output terminals 32L1 and 32L2 of the capacitors C1 and C2 of the adjacent charge pump units 321 and 322 or become the ground electric potential (0 V) under a condition in which the transistors TR6 and TR4 are in the ON state for the transistor TR8 and under a condition in which the transistor TR4 is in the ON state for the transistor TR6.

Accordingly, the low-voltage output terminal 32L1 of the capacitor C1 of the first stage can be adjusted to the electric potential of either the ground electric potential (0 V) or the output voltage Vo of the voltage source VS. Similarly, the low-voltage output terminal 32L2 of the capacitor C2 of the second stage can be adjusted to either the ground electric potential or 2× output voltage Vo. In addition, the low-voltage output terminal 32L of the capacitor C3 of the third stage can be adjusted to either the ground electric potential or the electric potential of 3× output voltage Vo. In accordance with the above-described adjustment, the high-voltage output terminal 32U1 of the capacitor C1 of the first stage can be adjusted to the electric potential of either the output voltage Vo or 2× output voltage Vo. In addition, the high-voltage output terminal 32U2 of the capacitor C2 of the second stage can be adjusted to the electric potential of either the output voltage Vo or 3× output voltage Vo. In addition, the high-voltage output terminal 32U of the capacitor C3 of the third stage can be adjusted to the electric potential of either the output voltage Vo or 4× output voltage Vo. In other words, the high-voltage power source voltage VU that has the electric potential of either the output voltage Vo or (4× output voltage Vo) is acquired from the high-voltage output terminal 32U of the charge pump 32, and the low-voltage power source voltage VL that has the electric potential of either the ground or (3× output voltage Vo) is acquired from the low-voltage output terminal 32L.

Here, as described above, the analog signal S1 for generating the driving signal S2 is supplied to the bases of the transistors TR1 and TR2 that constitute the driving transistor pair 31A from the CPU 21. In addition, the control signal S3 that is supplied from the CPU 21 is adjusted such that the low-voltage power source voltage VL, which is also the output voltages of the transistors TR7 and TR8, follows the driving signal S2 in the lower region. In other words, the low-voltage power source voltage VL is output from the low-voltage output terminal 32L of the charge pump 32 as a voltage acquired from subtracting a predetermined voltage value from the driving signal S2. On the other hand, the high-voltage power source voltage VU is generated as a voltage acquired from adding the charging voltage of the capacitors C1 to C3, that is, the output voltage Vo to the low-voltage power source voltage VL and is output from the high-voltage output terminal 32U.

Figure 6:
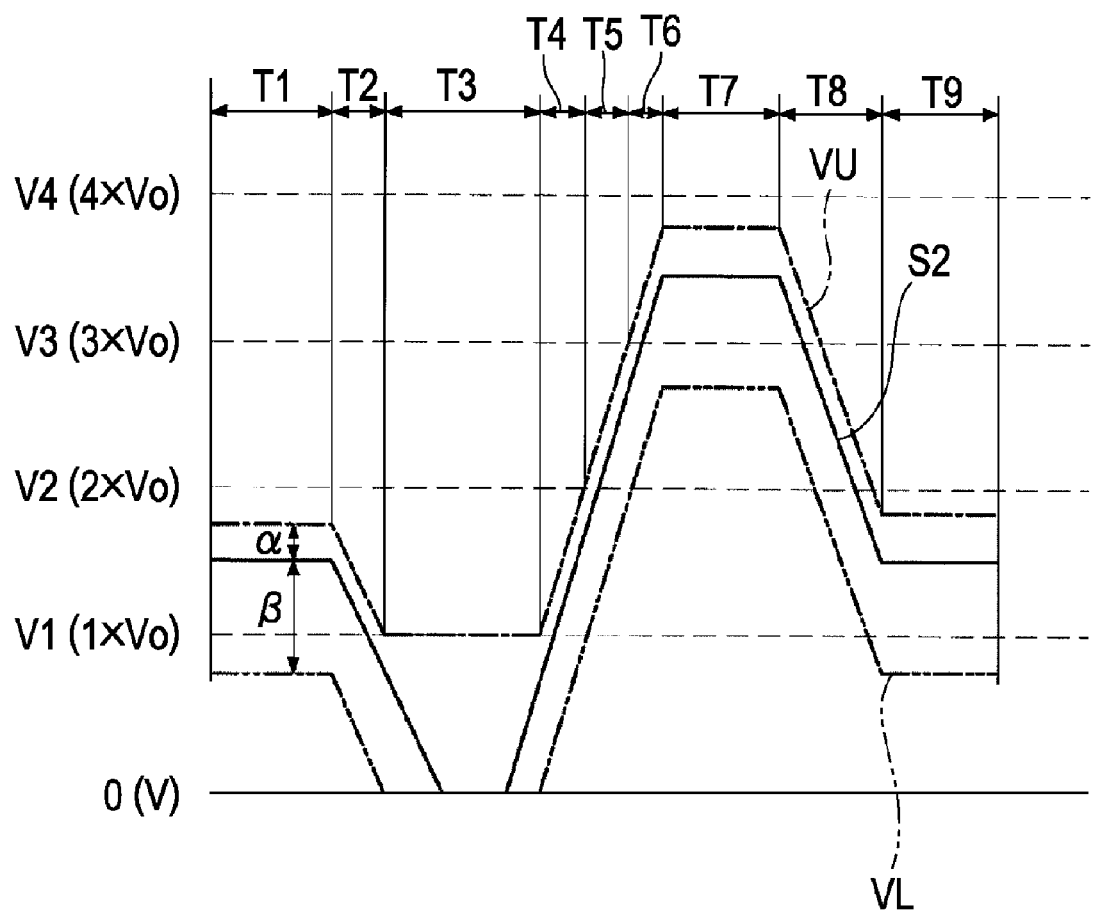
FIG. 6 is a waveform diagram showing relationship of a driving signal, a high-voltage power source voltage, and a low-voltage power source voltage according to an embodiment of the invention.

FIG. 6 is a waveform diagram showing relationship of the driving signal S2, the high-voltage power source voltage VU, and the low-voltage power source voltage VL. As shown in the figure, the waveform of the high-voltage power source voltage VU is denoted by a dashed-dotted line, the waveform of the driving signal S2 is denoted by a solid line, and the waveform of the low-voltage power source voltage VL is denoted by a dashed-two dotted line. In addition, a voltage V1 (Vo) is the output voltage of the power source VS, and a voltage V2 (2×Vo) is the maximum output voltage (the maximum voltage generated in the high-voltage output terminal 32U1) of the charge pump unit 321 of the first stage. In addition, a voltage V3 (3×Vo) is the maximum output voltage (the maximum voltage generated in the high-voltage output terminal 32U2) of the charge pump unit 322 of the second stage, and a voltage V4 (4×Vo) is the maximum output voltage (the maximum voltage generated in the high-voltage output terminal 32U) of the charge pump unit 323 of the third stage.

As shown in the figure, the high-voltage power source voltage VU changes so as to follow the waveform of the driving signal S2 in a voltage region higher than that of the driving signal S2, basically. In addition, the low-voltage power source voltage VL changes so as to follow the waveform of the driving signal S2 in a voltage region lower than that of the driving signal S2, basically.

The high-voltage power source voltage VU and the low-voltage power source voltage VL are generated through the following process. First, an addition voltage α to be added to the driving signal S2 for generating the high-voltage power source voltage VU is determined. Next, a subtraction voltage β is acquired by subtracting the addition voltage α from the output voltage Vo of the voltage source VS (=Vo−α), and the low-voltage power source voltage VL is acquired by subtracting the subtraction voltage β from the driving signal S2. As a result, Vo=α+β.

The control signal S3 is adjusted such that the low-voltage power source voltage VL is transited so as to follow the waveform of the driving signal S2 as a voltage acquired by subtracting the subtraction voltage β from the driving signal S2 based on the subtraction voltage β acquired through the above-described process. In particular, for example, it is preferable that the control signal S3 is generated by subtracting a predetermined voltage from the analog signal S1 that is generated by the CPU 21. It is apparent that a predetermined control signal S3 may be generated appropriately by storing data of the control signal S3 that is used for transiting the low-voltage power source voltage VL so as to follow the waveform of the driving signal S2 as a voltage acquired from subtracting the subtraction voltage β from the driving signal S2 in the CPU 21.

As a result, in period T1 in which the initial state is maintained, the low-voltage power source voltage VL that is lower than the driving signal S2 by the subtraction voltage β is generated in the low-voltage output terminal 32L, and the high-voltage power source voltage VU (that is higher than the low-voltage power source voltage VL by the output voltage Vo) that is higher than the driving signal S2 by the addition voltage α is generated in the high-voltage output terminal 32U. Thereafter, in period T2, the driving signal S2 starts to fall, and the electric potentials of the capacitors C1, C2, and C3 fall through the transistors TR4, TR6, and TR8 in accordance with the control signal S3 that follows the driving signal S2. Accordingly, the low-voltage power source voltage VL and the high-voltage power source voltage VU fall in accordance with the driving signal S2. Here, the low-voltage power source voltage VL cannot fall below the ground electric potential, and the high-voltage power source voltage VU cannot fall below the voltage V1 (the output voltage Vo). Thus, in period T3, although there is a period in which the driving signal S2 cannot be followed, the driving signal S2 starts to rise from the ground electric potential. Then, after a time point in which the difference between the driving signal S2 and the ground electric potential exceeds the subtraction voltage β, the electric potentials of the capacitors C1, C2, and C3 rise through the transistors TR3, TR5, and TR7 in accordance with the control signal S3. As a result, in period T4, the low-voltage power source voltage VL rises so as to follow the driving signal S2 while a predetermined difference between the low-voltage power source voltage VL and the driving signal is maintained, and the high-voltage power source voltage VU rises in accordance with the rise of the low-voltage power source voltage VL.

When the driving signal S2 continues to rise and the low-voltage power source voltage VL exceeds the voltage V1, the drain voltage of the transistor TR3 of the first stage is lower than the control signal S3. Accordingly, the transistor TR3 directly outputs the drain voltage, that is, a voltage V1.

As a result, the voltage rise is started by the charge pump unit 322 of the second stage. Accordingly, in period T5, the low-voltage power source voltage VL and the high-voltage power source voltage VU that follow the change in the driving signal S2 are generated by the charge pump unit 322 of the second stage.

Then, when the driving signal S2 continues to rise and the low-voltage power source voltage VL exceeds the voltage V2, the drain voltage of the transistor TR2 of the second stage is lower than the control signal S3. Accordingly, the transistor TR2 directly outputs the drain voltage, that is, a voltage V2. As a result, the voltage rise is started by the charge pump unit 322 of the charge pump unit 322 of the third stage. Accordingly, in period T6, the low-voltage power source voltage VL and the high-voltage power source voltage VU that follow the change in the driving signal S2 are generated by the charge pump unit 323 of the third stage.

Thereafter, the rise of the driving signal S2 stops. In period T7 in which this state is maintained, the low-voltage power source voltage VL and the high-voltage power source voltage VU do not change with a predetermined electric potential difference maintained therebetween.

In period T8, when the driving signal S2 starts to fall, the electric potentials of the capacitors C3, C2, and C1 fall through the transistors TR8, TR6, and TR4 in accordance with the control signal S3. As a result, in period T8, the low-voltage power source voltage VL and the high-voltage power source voltage VU fall in accordance with the driving signal S2 so as to return to the initial state in period T9.

According to this embodiment, charging and discharging of the capacitors C1, C2, and C3 of the charge pump units 321, 322, and 323 of each stage are controlled by the transistors (TR3 and TR4), (TR5 and TR6), and (TR7 and TR8) that are constituted by the FETs as the source followers. In addition, the control signal S3 following the driving signal S2 is input to the gates of the transistors (TR3 and TR4), (TR5 and TR6), and (TR7 and TR8), and the control signal S3 is adjusted such that the low-voltage power source voltage VL that is the output of the transistors (TR3 and TR4), (TR5 and TR6), and (TR7 and TR8) is lower than the driving signal S2. Accordingly, the high-voltage power source voltage VU that is higher than the driving signal S2 and the low-voltage power source voltage VL that is lower than the driving signal S2 can follow the driving signal S2 well.

In addition, although the charge pump units of three stages are shown in the above-described embodiment, the invention is not limited thereto. Thus, in principle, the configuration in which the charge pump unit forms only one stage may be used. However, as the number of the stages increases, the high-voltage power source voltage VU and the low-voltage power source voltage VL that sufficiently follow the waveform of the driving signal can be generated. Thus, the power consumption of the driving transistor pair 31A can be decreased as that much.

In addition, although the transistor pair as the power source has been described to be constituted by the FETs, the invention is not limited thereto. Thus, a configuration in which N-type and P-type bipolar transistors are connected complementarily may be used.

In addition, a case where a driving signal is input to the piezoelectric element 11 of a vertical vibration type has been described in the above-described embodiments. However, the invention is not limited thereto as a pressure generating unit that causes the pressure change in the pressure generating chamber 13. For example, an actuator device of a thick film type that is formed by using a method of bonding a green sheet or the like or a piezoelectric element of a thin film type may be used as the pressure generating unit.

What is claimed is:

1. A driving circuit for a capacitive load, the driving circuit comprising:
   a driving signal generating unit that generates a driving signal for driving the capacitive load by using a driving transistor pair including two transistors connected complementarily; and
   a power source voltage generating unit that generates a high-voltage power source voltage that is higher than the voltage of the driving signal and a low-voltage power source voltage that is lower than the voltage of the driving signal and applies the high-voltage power source voltage and the low-voltage power source voltage to the collectors of the driving transistors,
   wherein the power source voltage generating unit is configured by a power source transistor pair including two transistors connected complementarily and a capacitor of which low-voltage terminal is connected to an output side of the power source transistor pair, and
   wherein the low-voltage power source voltage is generated in an output side of the power-source transistor pair as a voltage that is in a voltage region lower than that of the driving signal and follows the driving signal and is output from a low-voltage terminal of the capacitor by supplying a control signal having a waveform following the driving signal to an input side of the power source transistor pair, and the high-voltage power source voltage is output from a high-voltage terminal of the capacitor as a voltage that is acquired from adding a charged voltage of the capacitor to the low-voltage power source voltage, is in a voltage region higher than that of the driving signal, and follows the driving signal.

2. The driving circuit for the capacitive load according to claim 1, wherein the power-source transistor pair is configured by a source follower of an N-channel FET and a P-channel FET.

3. The driving circuit for the capacitive load according to claim 1, wherein the power source voltage generating unit comprises a charge pump which is configured to have multiple stages by tandem-connecting a plurality of charge pumps.

4. The driving circuit for the capacitive load according to claim 1, wherein the capacitive load is a piezoelectric element of a liquid injecting head that injects liquid droplets through a nozzle opening by being deformed in accordance with application of a voltage.

5. A liquid injecting apparatus comprising the driving circuit for the capacitive load according to claim 4.

* * * * *